United States Patent
Tsuji

(10) Patent No.: US 7,046,501 B2
(45) Date of Patent: May 16, 2006

(54) CAPACITOR-EMBEDDED SUBSTRATE

(75) Inventor: Yoshiomi Tsuji, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 11/100,827

(22) Filed: Apr. 6, 2005

(65) Prior Publication Data
US 2005/0231889 A1  Oct. 20, 2005

(30) Foreign Application Priority Data
Apr. 16, 2004  (JP)  ............... 2004-121622

(51) Int. Cl.
*H01G 4/228*  (2006.01)
*H01G 4/30*   (2006.01)
*H01G 4/05*   (2006.01)

(52) U.S. Cl. ............... 361/306.2; 361/301.4; 361/303

(58) Field of Classification Search ......... 361/301.4, 361/303, 306.1, 306.2, 306.3, 307
See application file for complete search history.

(56) References Cited

U.S. PATENT DOCUMENTS

| 4,508,756 A | * | 4/1985 | Senda et al. ............ 427/81 |
| 5,323,520 A |   | 6/1994 | Peters et al. |
| 5,400,210 A | * | 3/1995 | Sugimoto et al. ........ 361/321.5 |
| 6,794,729 B1 | * | 9/2004 | Mori et al. ............ 257/532 |
| 2004/0238942 A1 | * | 12/2004 | Chakravorty et al. ...... 257/700 |
| 2004/0257749 A1 | * | 12/2004 | Otsuka et al. ........... 361/306.3 |

FOREIGN PATENT DOCUMENTS

JP  2001-358248  12/2001

* cited by examiner

*Primary Examiner*—Eric W. Thomas
(74) *Attorney, Agent, or Firm*—Beyer, Weaver & Thomas, LLP.

(57) ABSTRACT

A capacitor-embedded substrate for reliably compensating for fluctuation of a power source voltage is provided. A decoupling capacitor is formed between an input side electrode layer and an output side electrode layer via interlayer insulating layers, the decoupling capacitor includes a ground layer, a power source layer, and a dielectric layer interposed therebetween. A plurality of power supply terminals used for power supply to a semiconductor device is formed by patterning the output side electrode layer and is connected to the power source layer via a capacitor via.

6 Claims, 3 Drawing Sheets

CAPACITOR-EMBEDDED SUBSTRATE

BACKGROUND OF THE INVENTION

1. Field of the Invention

The present invention relates to a capacitor-embedded substrate having a decoupling capacitor embedded in order to reliably compensate for fluctuation of a power source voltage.

2. Description of the Related Art

Conventionally, when semiconductor devices of the form of a chip, such as ICs, LSIs, super LSIs, and CPUs using these devices, are mounted on a mounting substrate such as a printed wiring substrate, there has been known to use, as the mounting substrate, a capacitor substrate having a surface on which a decoupling capacitor for preventing malfunction of a semiconductor device due to fluctuation of a power source voltage is formed (for example, see Japanese Patent Application Publication No. 6-318672).

In addition, there has been proposed an interposer-typed capacitor-embedded substrate having a high capacitive decoupling capacitor embedded therein, which is provided between a mounting substrate and a semiconductor element (for example, see Japanese Patent Application Publication No. 2001-358248).

Recently, as one of various high performance components, a high performance capacitor-embedded substrate in which the fluctuation of the power source voltage can be reliably compensated for has been demanded.

In recent semiconductor devices, efforts to achieve high density and high speed in addition to downsizing and high performance have been made. According to the downsizing and the high performance of the semiconductor device, higher operational frequencies, for example, a high frequency band of more than GHz, have been used.

However, in the conventional capacitor-embedded substrate, the decoupling capacitor is coupled to a power supply terminal and so on through wiring lines in the unit of mm in a horizontal direction perpendicular to a thickness direction. Accordingly, since the decoupling capacitor is affected by the length of the wiring lines in the high frequency band of, particularly, more than GHz, inductive components due to the length of the wiring lines cannot be ignored. Such inductive components make the decoupling capacitor difficult or even impossible to fulfill its function. Accordingly, the conventional capacitor-embedded substrate has a problem in that the fluctuation of the power source voltage cannot be reliably compensated for.

SUMMARY OF THE INVENTION

The present invention has been finalized in view of the problem inherent in the conventional capacitor-embedded substrate, and it is an object of the present invention to provide a capacitor-embedded substrate in which the fluctuation of the power source voltage can be reliably compensated for.

To achieve the above object, the present invention provides a capacitor-embedded substrate disposed between a mount substrate and a semiconductor device, having a decoupling capacitor formed between an input side electrode layer and an output side electrode layer via an interlayer insulating layer, the decoupling capacitor including a pair of internal electrode layers composed of a ground layer and a power source layer, and a dielectric layer formed between the pair of internal electrode layers, wherein a plurality of power supply terminals used for power supply to the semiconductor device is formed by patterning the output side electrode layer and is connected to the power source layer via a capacitor via used for interlayer connection.

In the capacitor-embedded substrate according to the present invention, preferably, the decoupling capacitor is disposed immediately below the plurality of power supply terminals, power is supplied to each of the plurality of power supply terminals from a horizontal direction perpendicular to a thickness direction of the output side electrode layer, and the length of a wiring line of the capacitor via is less than 100 µm.

In the capacitor-embedded substrate according to the present invention, preferably, the dielectric layer is disposed to form the decoupling capacitor on an approximately entire surface of the ground layer.

In the capacitor-embedded substrate according to the present invention, preferably, capacitance of the decoupling capacitor is more than 1 $nF/mm^2$, and the capacitance of the decoupling capacitor can be varied depending on an area of the ground layer and a film thickness of the dielectric layer.

In the capacitor-embedded substrate according to the present invention, preferably, the capacitor via is formed of copper or its alloy, and the capacitor via and the power source layer are metallically coupled to each other in a thickness direction of the power source layer.

In the capacitor-embedded substrate according to the present invention, preferably, the dielectric layer is formed of silicon nitride and a film thickness of the dielectric layer is less than 1 µm, or the dielectric layer is formed of titanium oxide and a film thickness of the dielectric layer is less than 1 µm.

DESCRIPTION OF THE PREFERRED EMBODIMENT

Preferred embodiments of the present invention will now be described with reference to the accompanying drawings.

Figure 1:
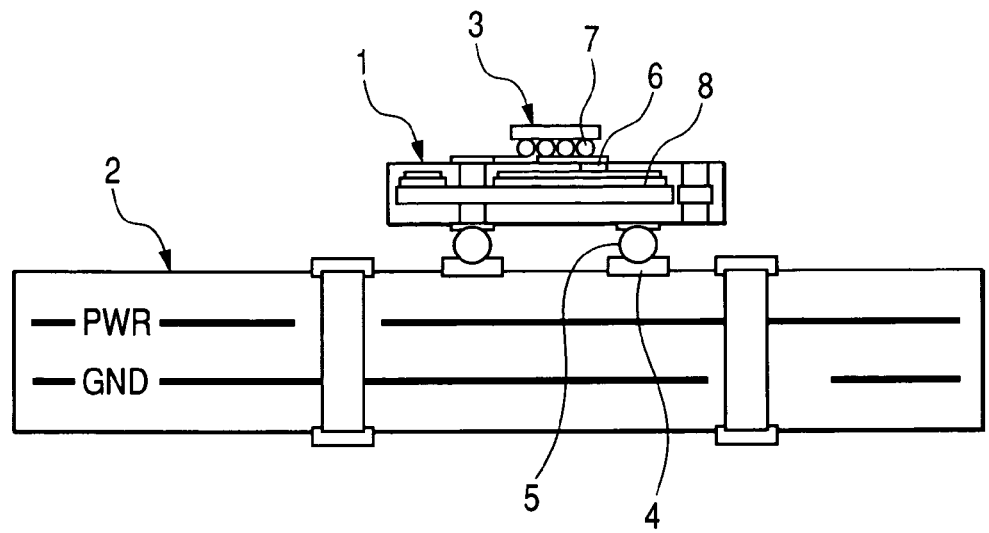
FIG. 1 is a simplified schematic view illustrating a configuration of a main portion of a capacitor-embedded substrate in a mounted state, according to a first embodiment of the present invention.

FIG. 1 is a simplified schematic view illustrating a configuration of a main portion of a capacitor-embedded substrate in a mounted state, according to a first embodiment of the present invention.

As shown in FIG. 1, a capacitor-embedded substrate 1 of this embodiment is of an interposer type, that is, is disposed between a mount substrate 2 such as a print wiring substrate and a semiconductor device 3 such as a CPU. In addition, on the top of the mount substrate 2 is formed a plurality of terminals 4 which is electrically connected to corresponding terminals 5, which are formed on the bottom of the capacitor-embedded substrate 1, via a bonding member such as solder. In addition, on the top of the capacitor-embedded substrate 1 is formed a plurality of terminals 6 which is electrically connected to corresponding terminals 7, which are formed on the bottom of the semiconductor device 3, via a bonding member such as solder. In addition, inside the capacitor-embedded substrate 1 is formed a decoupling capacitor 8 to which power source is supplied from the top of the capacitor-embedded substrate 1.

The capacitor-embedded substrate 1 of this embodiment will be now described in detail with reference to the enlarged sectional view of FIG. 2.

Figure 2:
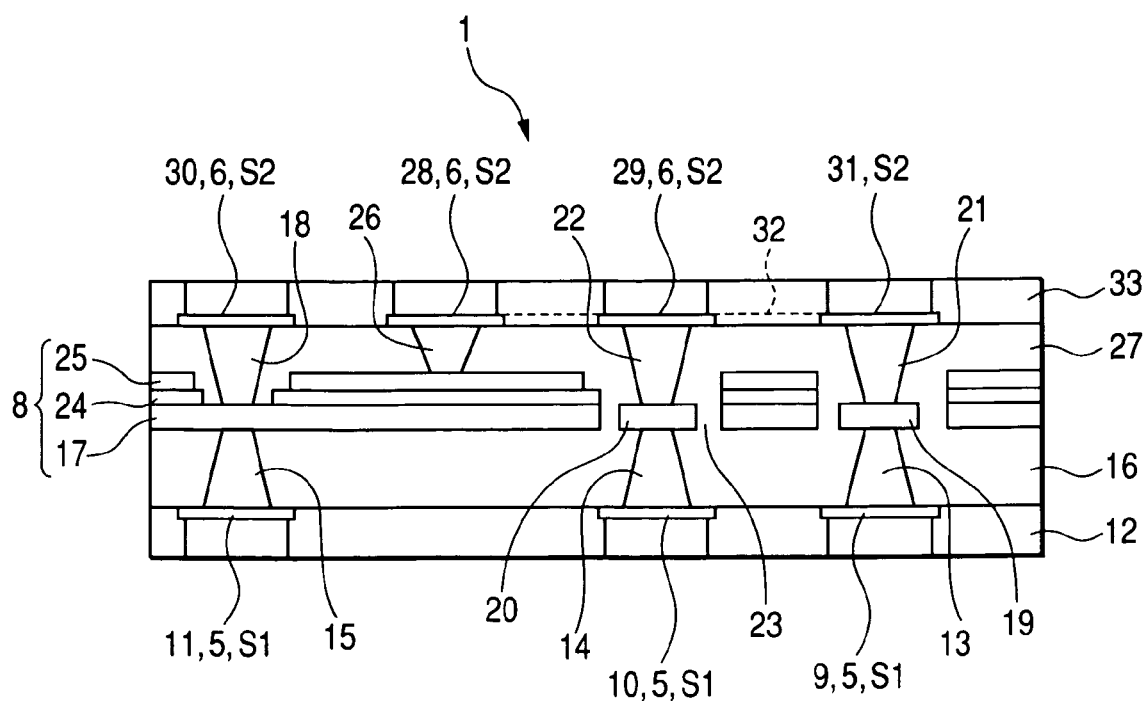
FIG. 2 is an enlarged sectional view illustrating a main portion of the capacitor-embedded substrate of FIG. 1.

As shown in FIG. 2, on the bottom of the capacitor-embedded substrate 1 of this embodiment are formed an input side power terminal 9, an input side signal terminal 10 and an input side ground terminal 11 as the plurality of terminals 5 corresponding to the plurality of terminals 4 of the mount substrate 2. For example, the input side power terminal 9, the input side signal terminal 10 and the input side ground terminal 11 are formed by patterning an input side electrode layer S1 formed of a metal film having conductivity, such as copper or its alloy having the thickness of 12 µm or so, into a predetermined pattern, using a photolithography method, and are supported and fixed by a rectangular input side solder resist 12 serving as an insulating protective film. In addition, the bottom of a lower power source via 13 is connected to the top of the input side power terminal 9, the bottom of a lower signal via 14 is connected to the top of the input side signal terminal 10, and the bottom of a lower ground via 15 is connected to the top of the input side ground terminal 11. The lower power source via 13, the lower signal via 14 and the lower ground via 15 are formed of conductive metal wirings, such as copper or its alloy, whose length in a thickness direction (vertical direction in FIG. 2, the same will apply hereinafter) is, for example, 25 µm or so.

On the top of the input side solder resist 12 is laminated a lower interlayer insulating layer 16 formed of an insulating material, such as polyimide or glass epoxy, and having a film thickness of 25 µm or so, such that the lower interlayer insulating layer 16 covers circumferences of the lower power source via 13, the lower signal via 14 and the lower ground via 15. The top of the lower interlayer insulating layer 16 has the same height as the tops of the lower power source via 13, the lower signal via 14 and the lower ground via 15.

On the top of the lower interlayer insulating layer 16 is laminated a ground layer 17 forming one of a pair of internal electrode layers forming a part of the decoupling capacitor 8. The ground layer 17 is formed by forming a conductive metal film, such as copper or its alloy, having a thickness of 2 to 5 µm, on the lower interlayer insulating layer 16, and patterning the metal film into a predetermined pattern using a photolithography method. In addition, the top of the lower ground via 15 is connected to a position of the bottom of the ground layer 17 corresponding to the input side ground terminal 11. In addition, at a predetermined position on the top of the ground layer 17, the bottom of an upper ground via 18 is connected to the top of the ground layer 17 at a predetermined position, for example, a position corresponding to the top of the lower ground via 15. The upper ground via 18 is formed of a conductive metal wiring, such as copper or its alloy, whose length in a thickness direction is, for example, 25 µm or so.

In the ground layer 17 are formed a power source connecting portion 19 and a signal connecting portion 20 which are respectively connected to the tops of the lower power source via 13 and the lower signal via 14. The power source connecting portion 19 and the signal connecting portion 20 are respectively formed to have a shape of an island, which is separate from the ground layer 17, at positions opposite to the tops of the lower power source via 13 and the lower signal via 14, by patterning the ground layer 17 into a predetermined pattern using a photolithography method. In addition, the top of the lower power source via 13 is connected to the bottom of the power source connecting portion 19 and the bottom of an upper power source via 21 is connected to the top of the power source connecting portion 19. In addition, the top of the lower signal via 14 is connected to the bottom of the signal connecting portion 20 and the bottom of an upper signal via 22 is connected to the top of the signal connecting portion 20. In addition, an intermediate interlayer insulating layer 23 for securing insulating property is disposed around each of the power source connecting portion 19 and the signal connecting portion 20. In addition, the tops of the upper power source via 21 and the upper signal via 22 are formed on the same plane as the top of the upper ground via 18. In addition, the upper power source via 21 and the upper signal via 22 are formed of conductive metal wirings, such as copper or its alloy, whose length in a thickness direction is, for example, 25 µm or so.

On the top of the ground layer 17 is laminated a dielectric layer 24 forming a part of the decoupling capacitor 8. On the dielectric layer 24 is formed of a material such as silicon nitride or titanium oxide having a film thickness of 1 µm or so. A film thickness of the dielectric layer 24 may be 0.1 to 3.0 µm, preferably, 0.1 to 1.0 µm. If the film thickness exceeds this thickness range, capacitance may not become large, and if the film thickness is less than this thickness range, the insulating property may not be secured. In addition, the dielectric layer 24 is formed on an approximately entire surface of the ground layer 17, more specifically, an entire surface of the ground layer 17 except for an interconnecting portion between the top of the ground layer 17 and the upper ground via 18. Of course, the dielectric layer 24 is not formed on the tops of the power connecting portion 19 and the signal connecting portion 20, which are formed separate from the ground layer 17.

On the top of the dielectric layer 24 is laminated a power source layer 25 forming the other of the pair of internal electrode layers forming a part of the decoupling capacitor 8. The power source layer 25 is formed by forming a conductive metal film, such as copper or its alloy, having a thickness of 2 to 5 µm, on the dielectric layer 24, and patterning the metal film into a predetermined pattern using a photolithography method. In addition, the bottom of a capacitor via 26 formed of copper or its alloy for supplying power to the decoupling capacitor 8 is connected to the top of the power source layer 25, by a metal coupling, to a predetermined position on the top of the power source layer 25, more specifically, a position corresponding to a plurality of terminals for power supply of the semiconductor device 3. That is, the decoupling capacitor 8 is formed immediately below the plurality of terminals for power supply of the semiconductor device 3.

In this embodiment, the decoupling capacitor 8 has capacitance of 3 $nF/mm^2$ or so by forming the dielectric layer 24 with a titanium oxide having a film thickness of 500 mm or so. The capacitance of the decoupling capacitor 8 is preferably more than 1 $nF/mm^2$. In addition, the capacitance of the decoupling capacitor 8 may be varied depending on an area of the ground layer 17, that is, a mount area which is an area of a plane of the capacitor-embedded substrate 1.

Although the decoupling capacitor 8 of this embodiment has the configuration where the dielectric layer 24 is interposed between the ground layer 17 and the power source layer 25, a plurality of dielectric layers 24 may be configured according to the design concept. In this case, it is important to form intermediate electrode layers between the plurality of dielectric layers 24.

The length of a wiring line in a thickness direction of the capacitor via 26 is 20 μm or so. In addition, the length of the wiring line of the capacitor via 26 is less than 100 μm, preferably, 10 to 50 μm. If the length exceeds this range, it may be difficult for the capacitor 26 to function as a capacitor due to increase of an inductance component. If the length is less than this range, an electrical property of interlayer insulating resin may be unstable.

In other words, the length of the wiring line in the thickness direction of the capacitor via 26 becomes the length of the wiring line of the decoupling capacitor 8 and it is easy to set the length of the wiring line of the decoupling capacitor 8 to be shorter than 100 μm.

On the top of the dielectric layer 24 is laminated an upper interlayer insulating layer 27 formed of an insulating material, such as polyimide or glass epoxy, and having a film thickness of 25 μm or so at maximum. The upper interlayer insulating layer 27 covers circumferences of the upper power source via 21, the upper signal via 22, the upper ground via 18 and the capacitor via 26. The top of the upper interlayer insulating layer 27 has the same height as the tops of the upper power source via 21, the upper signal via 22, the upper ground via 18 and the capacitor via 26.

On the top of the upper interlayer insulating layer 27, that is, on the top of the capacitor-embedded substrate 1 of this embodiment, are formed a plurality of power supply terminals (VCC) 28 as the terminals 6 corresponding to the terminals 7 of the semiconductor device 3, an output side signal terminal 29, an output side ground terminal 30, an output side power source terminal 31 is not directly connected to the terminals 7 of the semiconductor device 3, and a wiring line pattern 32 connecting the plurality of power supply terminals 28 to the output side power source terminal 31. The power supply terminals 28, the output side signal terminal 29, the output side ground terminal 30, the output side power source terminal 31, and the wiring line pattern 32 are formed by forming an output side electrode layer S2 formed of a conductive metal film, such as copper or its alloy, having a thickness of 12 μm or so, on the top of the upper interlayer insulating layer 27, and patterning the output side electrode layer S2 into a predetermined pattern using a photolithography method.

Of course, the wiring line pattern 32 is disposed such that it does not short with the output side signal terminal 29 and the output side ground terminal 30.

The power supply terminals 28, the output side signal terminal 29, the output side ground terminal 30, the output side power source terminal 31, and the wiring line pattern 32 are supported and fixed by an output side solder resist 33 serving as an insulating protective film. In addition, upper parts of the output side signal terminal 29, the output side ground terminal 30 and the power supply terminals 28 have respective openings. In external exposure portions of the respective openings is formed a gold/nickel pad (not shown) consisting of a lower nickel plating layer and an upper gold plating layer, as known in the prior art. In addition, surfaces of the output side power source terminal 31 and the wiring line pattern 32 are coated with the output side solder resist 33.

The top of the capacitor via 26 is connected to the bottoms of the power supply terminals 28 and the top of the upper signal via 22 is connected to the bottom of the output side signal terminal 29. In addition, the top of the upper ground via 18 is connected to the bottom of the output side ground terminal 30 and the top of the upper power source via 21 is connected to the bottom of the output side power source terminal 31. In addition, the wiring line pattern 32 has one end connected to a side of the output side power source terminal 31 and the other end branched and connected to sides of the plurality of power supply terminals 28.

That is, each power supply terminal 28 is formed to be branches for supply of power to the semiconductor device 3 and the decoupling capacitor 8.

Accordingly, the decoupling capacitor 8 is disposed immediately below each power supply terminal 28, power is supplied to each power supply terminal 28 by the wiring line pattern 32 from a horizontal direction perpendicular to a thickness direction of the output side electrode layer S2, and the length of the wiring line of the capacitor via is less than 100 μm.

Figure 3:
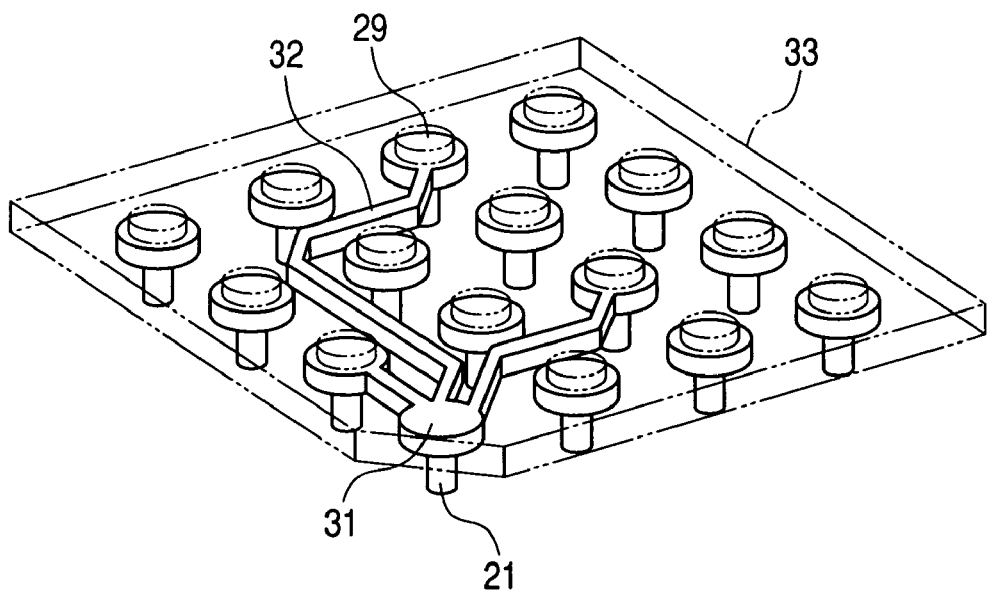
FIG. 3 is a perspective view illustrating an example of a structure of an interconnection between an output side power source terminal using a wiring line pattern and a plurality of power supply terminals.

FIG. 3 illustrates an example of a structure of an interconnection between the output side power source terminal 31 using the wiring line pattern 32 and the plurality of power supply terminals 28.

In the capacitor-embedded substrate 1 of this embodiment, in order to secure a close adhesion between each interlayer insulating layer 16, 23 and 27 and the ground and power source layers 17 and 25, which form the pair of internal electrode layers of the decoupling capacitor 8, an adhesive agent or a chemical adsorptive film such as triazinethiol may be used. In addition, a triazinethiol-containing organic material including carbon and nitrogen and having permittivity ϵ of more than 60 may be used as material of the dielectric layer 24. In addition, a high-permittivity material made by dispersing metal particles having a size of an order of nanometer into a polymeric resin may be used as the material of the dielectric layer 24 (nanomaterial). Such organic materials can attain capacitance of several tens to several hundreds $nF/mm^2$. In addition, when such organic materials are used as the material of the dielectric layer 24, it is important to use a method such as a thermo compression method by which the dielectric layer 24 is not injured when the power source layer 25 is bonded to the capacitor via 26.

Next, operation of this embodiment as configured above will be described.

Figure 4:
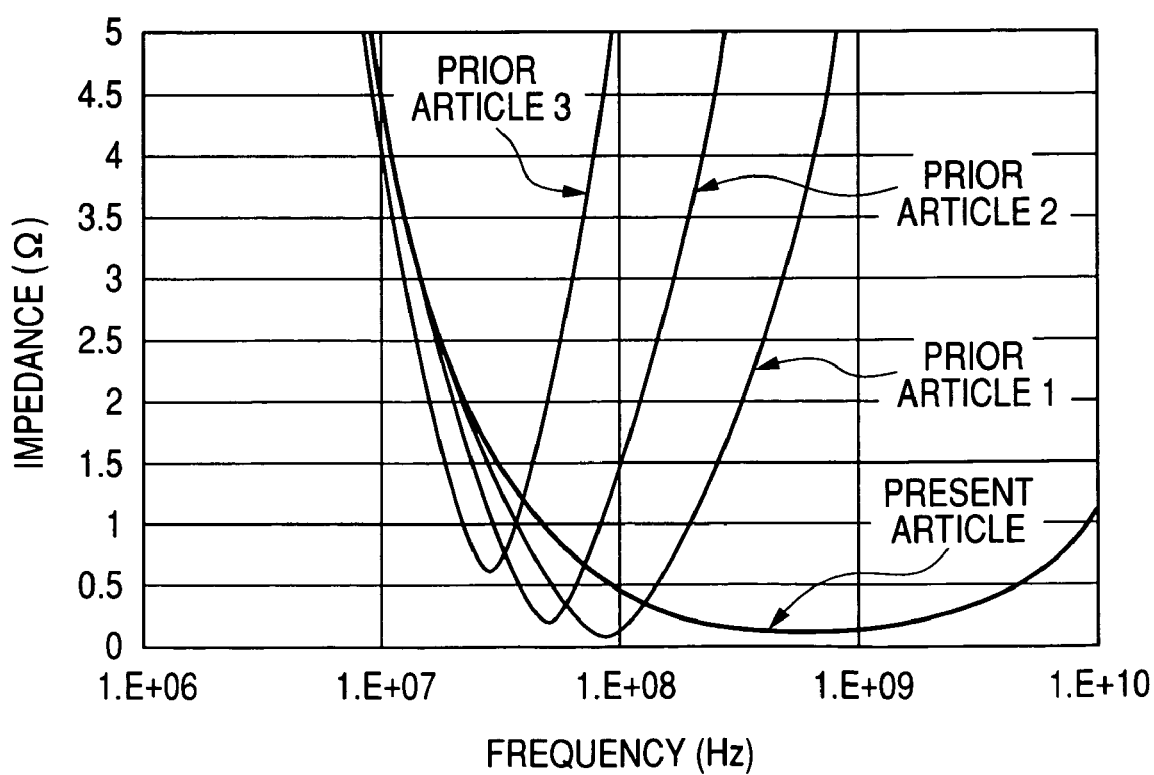
FIG. 4 is a graphical view illustrating a relationship between an impedance and a frequency depending on a length of a wiring line.

In the capacitor-embedded substrate 1 of this embodiment, since the plurality of power supply terminals 28 used for power supply to the semiconductor device 3 is formed by patterning the output side electrode layer S2 and these power supply terminals 28 are connected to the power source layer 25 of the decoupling capacitor 8 by only the capacitor via 26 used for interlayer connection, the decoupling capacitor 8 for compensating for the power source voltage of the semiconductor device 3 can be connected to only the capacitor via 26 in the longitudinal direction of the wiring line. As a result, since an ideal structure where the inductance component can be removed at maximum can be attained, the decoupling capacitor 8 can sufficiently function as a capacitor even in a high frequency band of more than GHz. This can be confirmed through a simulation for a relationship between an impedance and a frequency depending on the length of the wiring line. FIG. 4 shows a result of a simulation for a relationship between an impedance and a frequency depending on the length of the wiring line. In this simulation, the capacitance of the decoupling capacitor 8 is 3.5 nF/mm$^2$, an article where the length of the power source wiring line to the decoupling capacitor 8 in a direct-below form by only the capacitor via 26 is 100 µm is taken as the present article, an article where the wiring line length by the prior power source wiring is 1 mm is taken as prior article 1, an article where the wiring line length by the prior power source wiring is 3 mm is taken as prior article 2, and an article where the wiring line length by the prior power source wiring is 9 mm is taken as prior article 3. As shown in FIG. 4, it can be confirmed that the impedance can become lower in a wide frequency band as the wiring line length becomes shorter.

Accordingly, with the capacitor-embedded substrate 1 of this embodiment, the fluctuation of the power source voltage can be reliably compensated for.

In addition, in the capacitor-embedded substrate 1 of this embodiment, since the power supply terminals 28 are connected to the power source layer 25 of the decoupling capacitor 8 by only the capacitor via 26 used for interlayer connection, a path of power supply to the decoupling capacitor 8 can be simply minimized. As a result, since the capacitor-embedded substrate 1 can be obtained by a simple manufacturing process, productivity of the substrate can be improved and product costs can be lowered.

In addition, methods other than the photolithography method may be applied to the present invention. For example, the dielectric may be formed by printing methods including an offset printing method, a screen printing method, etc. In addition, the electrodes may be formed by plating using a semi-additive method or a full additive method.

In addition, in the capacitor-embedded substrate 1 of this embodiment, since the decoupling capacitor 8 is disposed immediately below the plurality of power supply terminals 28, power is supplied to each power supply terminal 28 by the wiring line pattern 32 from a horizontal direction perpendicular to a thickness direction of the output side electrode layer S2, and the length of the wiring line of the capacitor via 26 is less than 100 µm, a manufacturing process can be further simplified. In addition, since an ideal structure where the inductance component can be removed at maximum can be attained, the decoupling capacitor 8 can sufficiently function as a capacitor even in a high frequency band of more than GHz.

In addition, in the capacitor-embedded substrate 1 of this embodiment, since the decoupling capacitor 8 is disposed on the approximately entire surface of the ground layer 17, the capacitor-embedded substrate 1 itself may be used as the decoupling capacitor 8. As a result, large capacitance of the decoupling capacitor 8 and low impedance in a wide frequency band can be easily attained.

In addition, in the capacitor-embedded substrate 1 of this embodiment, since the capacitance of the decoupling capacitor 8 is more than 1 nF/mm$^2$, and the capacitance of the decoupling capacitor 8 may be varied depending on an area of the ground layer 17, that is, a mount area of the capacitor-embedded substrate 1, large capacitance of the decoupling capacitor 8 can be easily attained.

In addition, in the capacitor-embedded substrate 1 of this embodiment, since the capacitor via 26 is formed of copper or its alloy and the capacitor via 26 and the power source layer 25 are metallically coupled to each other in a thickness direction of the power source layer 25, an interlayer connection can be attained with low resistance, at low costs, and high reliability, unlike a conventional connection between metals of different kinds.

In addition, in the capacitor-embedded substrate 1 of this embodiment, since the dielectric layer 24 is formed of the silicon nitride or the titanium oxide having the film thickness less than 1 µm, large capacitance of the decoupling capacitor 8 can be reliably and easily attained.

In addition, since triazinethiol having permittivity $\epsilon$ of more than 300 or nanomaterial having permittivity $\epsilon$ of more than 200 is used for the dielectric layer 24, the capacitance of several tens to several hundreds nF/mm$^2$ can be attained.

Figure 5:
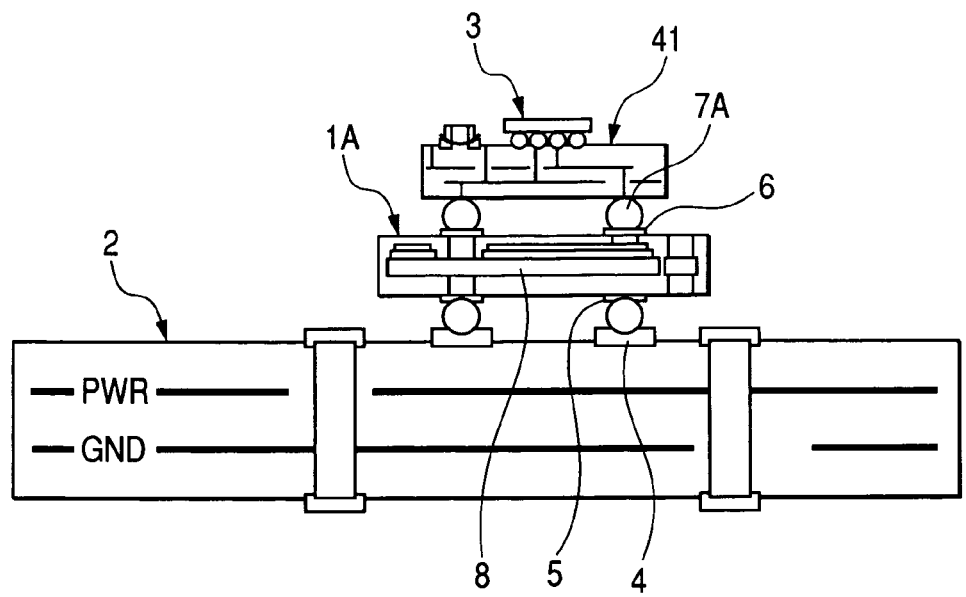
FIG. 5 is a simplified schematic view illustrating a configuration of a main portion of a capacitor-embedded substrate in a mounted state, according to a second embodiment of the present invention.
Figure 6:
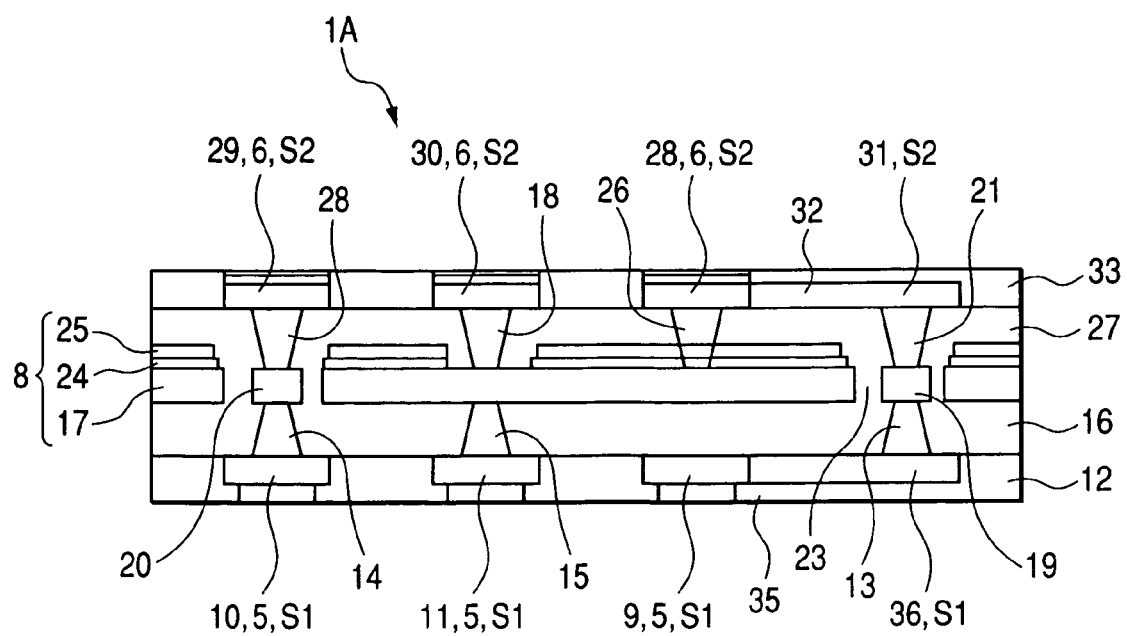
FIG. 6 is an enlarged sectional view illustrating a main portion of the capacitor-embedded substrate of FIG. 5.

FIGS. 5 and 6 illustrate a capacitor-embedded substrate according to a second embodiment of the present invention. FIG. 5 is a simplified schematic view illustrating a configuration of a main portion of the capacitor-embedded substrate in a mounted state, and FIG. 6 is an enlarged sectional view illustrating a main portion of the capacitor-embedded substrate. In the second embodiment, the same or equivalent components as the capacitor-embedded substrate 1 of the first embodiment are denoted by the same reference numerals.

As shown in FIG. 5, a capacitor-embedded substrate 1A of this embodiment is of a socket type, that is, is disposed between a mount substrate 2 such as a print wiring substrate and an interposer 41 on which a semiconductor device 3 is mounted. In addition, on the top of the mount substrate 2 is formed a plurality of terminals 4 which is electrically connected to corresponding terminals 5, which are formed on the bottom of the capacitor-embedded substrate 1A, via a bonding member such as solder. In addition, on the top of the capacitor-embedded substrate 1A is formed a plurality of terminals 6 which is electrically connected to corresponding terminals 7A, which are formed on the bottom of the interposer 41, via a bonding member such as solder. In addition, inside the capacitor-embedded substrate 1A is formed a decoupling capacitor 8 to which power source is supplied from the top of the capacitor-embedded substrate 1A, as shown in FIGS. 5 and 6. In addition, in the capacitor-embedded substrate 1A of this embodiment, a plurality of input side power source terminals (only one terminal is shown in FIG. 6) 9 is connected, via an input side wiring line pattern 35, to one input side power source terminal 36, which is not directly connected to the terminals 4 of the mount substrate 2, and the bottom of a lower power source via 13 is connected to the top of the input side power source terminal 36.

More specifically, the input side wiring line pattern 35 has one end connected to a side of the input side power source terminal 36 and the other end branched and connected to sides of a plurality of input side power source terminal 36. The input side wiring line pattern 35 and the input side power source terminals 36 are formed by patterning an input side electrode layer S1 into a predetermined pattern using a photolithography method, at the same time of forming the input side power source terminals 9, an input side signal terminal 10 and an input side ground terminal 11.

In addition, the configuration where the plurality of input side power source terminals 9 is connected, via the input side wiring line pattern 35, to one input side power source terminal 36, and the bottom of the lower power source via 13 is connected to the top of the input side power source terminal 36 may be used in the capacitor-embedded substrate 1 of the first embodiment.

Except the above-described configuration in connection with the second embodiment, the capacitor-embedded substrate 1A has the same configuration as the capacitor-embedded substrate 1 of the first embodiment, and therefore, detailed explanation thereof will be omitted.

The capacitor-embedded substrate 1A of the second embodiment as configured above has the same effect as the capacitor-embedded substrate 1 of the first embodiment.

In addition, the present invention is not limited to the above-described embodiments, and may be modified in various ways if necessary.

The capacitor-embedded substrate according to the invention has a remarkable effect that the fluctuation of the power source voltage can be reliably compensated.

What is claimed is:

1. A capacitor-embedded substrate disposed between a mount substrate and a semiconductor device, comprising a decoupling capacitor formed between an input side electrode layer and an output side electrode layer via an interlayer insulating layer, the decoupling capacitor having a pair of internal electrode layers composed of a ground layer and a power source layer, and a dielectric layer formed between the pair of internal electrode layers, wherein a plurality of power supply terminals used for power supply to the semiconductor device is formed by patterning the output side electrode layer and is connected to the power source layer via a capacitor via used for interlayer connection, and wherein the decoupling capacitor is disposed immediately below the plurality of power supply terminals, power is supplied to each of the plurality of power supply terminals from a horizontal direction perpendicular to a thickness direction of the output side electrode layer, and the length of a wiring line of the capacitor via is less than 100 μm.

2. The capacitor-embedded substrate according to claim 1, wherein the dielectric layer is disposed to form the decoupling capacitor on an approximately entire surface of the ground layer.

3. The capacitor-embedded substrate according to claim 1, wherein capacitance of the decoupling capacitor is more than 1 nF/mm$^2$, and the capacitance of the decoupling capacitor can be varied depending on an area of the ground layer and a film thickness of the dielectric layer.

4. The capacitor-embedded substrate according to claim 1, wherein the capacitor via is formed of copper or its alloy, and the capacitor via and the power source layer are metallically coupled to each other in a thickness direction of the power source layer.

5. The capacitor-embedded substrate according to claim 1, wherein the dielectric layer is formed of silicon nitride and a film thickness of the dielectric layer is less than 1 μm.

6. The capacitor-embedded substrate according to claim 1, wherein the dielectric layer is formed of titanium oxide and a film thickness of the dielectric layer is less than 1 μm.

* * * * *